United States Patent
Akiyama et al.

(12)

(10) Patent No.: US 6,777,707 B2
(45) Date of Patent: Aug. 17, 2004

(54) SEMICONDUCTOR INTEGRATED CIRCUIT WITH VOLTAGE DOWN CONVERTER ADAPTABLE FOR BURN-IN TESTING

(75) Inventors: Mihoko Akiyama, Hyogo (JP); Akira Yamazaki, Hyogo (JP); Fukashi Morishita, Hyogo (JP); Yasuhiko Taito, Hyogo (JP); Nobuyuki Fujii, Hyogo (JP); Mako Okamoto, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 0 days.

(21) Appl. No.: 10/201,080

(22) Filed: Jul. 24, 2002

(65) Prior Publication Data

US 2003/0020095 A1 Jan. 30, 2003

(30) Foreign Application Priority Data

Jul. 25, 2001 (JP) .................................. 2001-224041
May 23, 2002 (JP) .................................. 2002-149577

(51) Int. Cl.$^7$ ........................... H01L 23/58; H02J 19/82
(52) U.S. Cl. ........................ 257/48; 327/530; 327/535; 327/538
(58) Field of Search .............................. 257/48; 438/11, 438/14, 15, 18; 327/530, 535, 537, 538; 365/189.09, 226, 201; 324/760, 765, 158.1

(56) References Cited

U.S. PATENT DOCUMENTS

| 5,400,290 A | * | 3/1995 | Suma et al. ................. 365/226 |
| 5,510,749 A | * | 4/1996 | Arimoto ..................... 327/546 |
| 6,038,189 A | * | 3/2000 | Morishita ................... 365/227 |
| 6,097,180 A | * | 8/2000 | Tsukude et al. ............ 323/313 |

FOREIGN PATENT DOCUMENTS

JP          4-311898          11/1992

OTHER PUBLICATIONS

Kiyoo Ito, "Ultra LSI Memory", Advanced Electronics Series, I–9, Baifukan, Nov. 5, 1994, pp. 292–303.
Nakano et al., "ULSI DRAM Technology", Science Forum, Sep. 25, 1992, pp. 131–134.

* cited by examiner

*Primary Examiner*—David Nelms
*Assistant Examiner*—Long Tran
(74) *Attorney, Agent, or Firm*—McDermott, Will & Emery

(57) ABSTRACT

A VDC circuit that supplies an internal voltage VDD1 to an internal circuit in a normal operation forces a transistor off in a burn-in test mode through input of a test signal to suppress supply of an external power supply voltage VDDH to a node. In a burn-in test mode, an external power supply voltage lower than external power supply voltage VDDH and higher than internal voltage VDD1 is supplied from an external pad.

10 Claims, 10 Drawing Sheets

VREF CHARACTERISTIC

SEMICONDUCTOR INTEGRATED CIRCUIT WITH VOLTAGE DOWN CONVERTER ADAPTABLE FOR BURN-IN TESTING

BACKGROUND OF THE INVENTION

1. Field of the Invention

The present invention relates to semiconductor integrated circuits, particularly to a circuit configuration of a voltage down converter.

2. Description of the Background Art

Reflecting the demand for multifunction circuitry and lower power consumption, attention is now focused on a circuit that has ASIC (Application Specific IC) circuitry and DRAM (Dynamic Random Access Memory) circuitry embedded in one chip (referred to as an eDRAM (embedded Dynamic Random Access Memory) circuit hereinafter).

Also, there is a demand for miniaturization of transistors in order to increase the scale of integration and high performance of the transistor. Circuitry is configured with two types of transistors differing in the oxide film thickness, i.e., a transistor with a thin gate oxide film and a transistor with a normal gate oxide film (also called thin film transistor and thick film transistor hereinafter) according to the application. Specifically, the entire area of circuitry is reduced by configuring a circuit that is driven at a high operating voltage with a thick film transistor and a circuit driven that is driven at a low operating voltage with a thin film transistor.

FIG. 12 is a schematic diagram of an eDRAM circuit 10000. Referring to FIG. 12, eDRAM circuit 10000 includes DRAM circuitry 10 and ASIC circuitry 11.

In ASIC circuitry 11 in eDRAM circuit 10000 of FIG. 12, a thin film transistor having a thin gate oxide film that is driven at a low operating voltage (approximately 1V to 2V) is employed. In DRAM circuitry 10, two types of transistors driven at a high operating voltage and a low operating voltage, i.e., a thin film transistor and a thick film transistor, are employed according to the application of the control circuit. Specifically, a high voltage of at least the level of a voltage of an H (logical high) level plus a threshold voltage (approximately 3.6V) is applied to the gate of the transistor that forms the memory cell in DRAM circuitry 10 by boosting the word line in a data reading and writing mode. Such a high voltage to the gate of a thin film transistor will cause damage. Therefore, a thick film transistor is used for transistors configuring memory cells. The same applies to other embedded control circuits. A mixture of thick film and thin film transistors are employed in accordance with the application, and an external power supply voltage VDDH of high voltage and an external power supply voltage VDDL of low voltage are employed corresponding to respective transistors.

In circuitry that is related to control of higher accuracy, there is provided a control circuit formed of a thin film transistor that operates upon receiving a predetermined internal voltage generated within the system instead of directly using external power supply voltages VDDH and VDDL in DRAM circuitry 10. A voltage down converter (also called a VDC circuit) is generally employed to generate such an internal voltage. Since this VDC circuit receives a high voltage VDDH for operation, the VDC circuit must be formed of a thick film transistor.

FIG. 13 is a schematic diagram of a conventional VDC circuit 3000 that generates a predetermined internal voltage with respect to a control circuit formed of a thin film transistor.

VDC circuit 3000 receives a reference voltage VREF to generate an internal voltage VDD1 of a level identical to that of reference voltage VREF. VDC circuit 3000 includes a differential amplifier 100, and a P channel MOS transistor P5.

Differential amplifier 100 generates an output voltage CMP according to the voltage difference between reference voltage VREF and internal voltage VDD1. Transistor P5 is connected between external power supply voltage VDDH and a node N14, receiving output voltage CMP of differential amplifier 100 at its gate.

FIG. 14 shows a circuit structure of differential amplifier 100.

Differential amplifier 100 includes P channel MOS transistors 101 and 102, and N channel MOS transistors 103–105.

N channel MOS transistor 105 is connected between a node N3 and ground voltage GND, and receives a bias voltage BIAS at its gate. P channel MOS transistor 102 is disposed between external power supply voltage VDDH and a node N5, and has its gate connected to node N4. N channel MOS transistor 104 is disposed between nodes N5 and N3, and receives reference voltage VREF at its gates. P channel MOS transistor 101 is disposed between external power supply voltage VDDH and node N4, and has its gate connected to node N4. N channel MOS transistor 103 is disposed between node N3 and node N4, and receives an internal voltage VDD1 at its gate. Differential amplifier 100 is supplied with a constant current corresponding to the voltage level of signal BIAS as the operating current. This differential amplifier 100 is of the so-called current mirror configuration, and provides an output voltage CMP according to the voltage difference between internal voltage VDD1 and reference voltage VREF.

FIG. 15 shows a circuit configuration of a reference voltage generation circuit 200 that generates reference voltage VREF.

Reference voltage generation circuit 200 includes a constant current source 224 connected to external power supply voltage VDDH, and supplying a constant current Ids, and N channel MOS transistors 212 and 213.

Each of N channel MOS transistors 212 and 213 provided in series between an output node N7 and ground voltage GND is diode-connected. These diode-connected transistors function as resistance elements.

Reference voltage generation circuit 200 generates reference voltage VREF at output node N7. Reference voltage VREF corresponds to a value of constant current Ids supplied by constant current source 224 multiplied by the combined resistance of the number of stages of the diode-connected transistors. For example, if the combined resistance of transistors 212 and 213 functioning as resistance elements is RS1, the value of reference voltage VREF is set to constant current Ids×combined resistance RS1.

FIG. 16 is a VREF characteristic diagram of a reference voltage generation circuit. Reference voltage VREF exhibits a substantially constant level even if power supply voltage VDDH rises, as shown in FIG. 16. Since the value of reference voltage VREF can be set based on constant current Ids of constant current source 224, reference voltage generation circuit 200 is not easily affected by a change in the external power supply voltage. An accurate reference voltage VREF can be supplied steadily.

An operation of VDC circuit 3000 in a normal mode will be described here.

When internal voltage VDD1 having the current consumed by the memory cell becomes lower than the voltage level of reference voltage VREF, the level of output voltage CMP, i.e., the gate voltage of P channel MOS transistor P5, is reduced. Accordingly, P channel MOS transistor P5 is rendered conductive, whereby the level of internal voltage VDD1 rises. When internal voltage VDD1 becomes higher than the level of reference voltage VREF, the level of output voltage CMP rises. In response, P channel MOS transistor P5 is rendered non-conductive, whereby the current supply at node N14 is suppressed. Accordingly, internal voltage VDD1 drops to the level of reference voltage VREF.

Thus a predetermined internal voltage VDD1 generated within the system based on an external power supply voltage is generated by a VDC circuit. An accurate internal voltage VDD1 is supplied to a control circuit formed of a thin film transistor.

In order to remove initial failure in advance, accelerated operation aging is applied on the device for a predetermined period of time to screen out any defective products. Burn-in testing is generally employed as one method of screening. The burn-in testing is a method of directly evaluating the dielectric film based on the actual device. By applying stress of high temperature and high electric field, various defective factors such as migration of aluminum wiring are elicited.

In a general burn-in test, a power supply voltage higher than that of normal operation is applied to the transistor forming the control circuit to apply stress of high electric field. Although acceleration of the burn-in testing is increased thereby, there is a possibility of the gate oxide film and the like of the transistor being damaged if the power supply voltage is too high during burn-in testing.

Therefore, an external power supply voltage VDDH# (VDDH# >VDDH) corresponding to external power supply voltage VDDH that is the operating voltage boosted to a predetermined voltage level is supplied to a control circuit formed of a thick film transistor. As to a control circuit formed of a thin film transistor in the above-described eDRAM circuit, an external power supply voltage VDDL# (VDDL#>VDDL) corresponding to external power supply voltage VDDL that is the operating voltage boosted to a predetermined voltage level is supplied. Burn-in testing is conducted based on such supplied voltages.

Internal voltage VDD1 supplied to a control circuit related to accurate control is not affected by a change in the external power supply voltage, as mentioned above. Therefore, burn-in testing cannot be conducted for a control circuit formed of a thin film transistor that operates upon receiving internal voltage VDD1, likewise other control circuits.

An approach of supplying an external power supply voltage VDDL# for burn-in testing of a thin film transistor as internal voltage VDD1 in a burn-in test mode can be considered.

Referring to FIG. 13 again, a burn-in voltage supply circuit 3001 is provided for VDC circuit 3000.

Burn-in voltage supply circuit 3001 includes a P channel MOS transistor P6 connected between an external power supply voltage VDDL# for burn-in testing and node N14. P channel MOS transistor P6 receives an input of a burn-in test control signal BI at its gate. Transistor P6 has its substrate electrically coupled to node N14.

An approach of supplying external power supply voltage VDDL# to a control circuit formed of a thin film transistor as internal voltage VDD1 by driving burn-in test control signal BI to an L level (logical low) to turn on P channel MOS transistor P6 can be considered.

According to the structure of supplying a power supply voltage for burn-in testing by means of VDC circuit 3000 and burn-in voltage supply circuit 3001 shown in FIG. 13, both transistors P5 and P6 operate, and are electrically connected to node N14. This structure induces the possibility of the voltage level of the source of transistor P6, for example, being increased prior to the rise of the voltage level of node N14 electrically coupled to the substrate, depending upon the raising order of the external power supply voltages VDDH# and VDDL#. In this case, the so-called latch up occurs at P channel MOS transistor P6. This latch up occurs in the so-called CMOS structure formed of a P channel MOS transistor and an N channel MOS transistor.

FIG. 17 is a sectional view of a CMOS structure formed of a P channel MOS transistor P6 of FIG. 13 and an N channel MOS transistor 105 included in differential amplifier 100 adjacent thereto.

Resistors R1 and R2 and transistors PNP1 and NPN2 are parasitic resistors and parasitic bipolars. Here, the transistor formed at the P well is N channel MOS transistor 105 whereas the transistor formed at the N well is P channel MOS transistor P6.

FIG. 18 is a circuit diagram of an equivalent circuit of the parasitic thyristor formed from the cross sectional view of FIG. 17. This circuit is not a circuit disposed at the substrate, but a parasitic circuit generated by the arrangement of transistors.

Parasitic resistor R1 and parasitic bipolar NPN2 are connected in series between an input node N16 and ground voltage GND, and has its connection node connected to the gate of parasitic bipolar PNP1. Parasitic resistor R2 and parasitic bipolar PNP1 are connected in series between an input node N15 and ground voltage GND, and have their connection node connected to the gate of parasitic bipolar NPN2. Parasitic diode D1 is connected between input nodes N15 and N16 with the forward direction from input node N15 to node N16. Input nodes N15 and N16 receive the inputs of an external power supply voltage VDDL# and an internal voltage VDD1, respectively.

When external power supply voltage VDDL# is pulled up first, forward current flows towards PN parasitic diode D1. The presence of parasitic resistor R1 causes forward bias between the base and emitter of parasitic bipolar transistor PNP1. Amplified current flows between the emitter and the collector. This current will amplify the current between the emitter and collector of parasitic bipolar NPN2. The PNPN thyristor is turned on based on the parasitic bipolar transistor inherent in the CMOS device. Accordingly, excessive current flows between external power supply voltage VDDL-# and GND. Thus, latch up occurs. The occurrence of latch up will not only disrupt the operation of the device, but may also damage the device per se when the heat generated by the excessive current is great.

FIG. 19 shows a circuit structure of a VDC circuit 3100 having burn-in voltage supply circuit 3001 replaced with a burn-in voltage supply circuit 3002. Burn-in voltage supply circuit 3002 includes a P channel MOS transistor P7. Burn-in voltage supply circuit 3002 differs from burn-in voltage supply circuit 3001 in that the substrate voltage of P channel MOS transistor P6 is connected to external power supply voltage VDDL#. The remaining elements are similar.

Latch up likewise occurs in the circuit of a structure modified in the connection of the substrate voltage of the transistor, depending upon the rising order of external power supply voltage VDDL# and external power supply voltage VDDH#.

FIG. 20 is a sectional view of a CMOS structure formed of a P channel MOS transistor P7 and an N channel MOS transistor 105 included in differential amplifier 100 adjacent thereto.

Resistors R1 and R2 and transistors PNP1 and NPN2 are parasitic resistors and parasitic bipolars, respectively. Here, the transistor formed at the P well is N channel MOS transistor 105 whereas the transistor formed at the N well is P channel MOS transistor P7.

FIG. 21 is an equivalent circuit of a parasitic thyristor formed from the sectional structure of FIG. 20.

The structure of FIG. 21 is similar to that described with reference to FIG. 18. Therefore, detailed description thereof will not be repeated here. It is to be noted that an internal voltage VDD1 and an external power supply voltage VDDL# are applied to input nodes N15 and N16, respectively.

According to the present structure, when external power supply voltage VDDH# is pulled up first, i.e. when internal voltage VDD1 is pulled up prior to external power supply voltage VDDL#, forward current will flow to PN parasitic diode D1 due to the low level of the substrate voltage even in the case where the substrate voltage of the P channel MOS transistor is changed to external power supply voltage VDDL#. The presence of parasitic resistor R1 causes bias in the forward direction between the base and emitter of parasitic bipolar PNP1 to conduct a flow of amplified current between the emitter and collector. As a result, that current may cause latch up, i.e., amplify the current between the emitter and collector of parasitic bipolar NPN1. Here, latch up has been described based on a CMOS structure formed of respective transistors P6 and P7 and transistor 105. Similarly, there is a possibility of latch up in a CMOS structure formed of a transistor P5 and transistor 105.

Therefore, the rising order of the external power supply voltage must be taken into consideration in conducting a burn-in test of a control circuit that operates based on internal voltage VDD1. An efficient burn-in test could not be conducted.

SUMMARY OF THE INVENTION

An object of the present invention is to provide a semiconductor integrated circuit that can execute burn-in testing efficiently in a control circuit that receives an input of internal voltage VDD1 from a VDC circuit for operation.

According to an aspect of the present invention, a semiconductor integrated circuit includes a first internal circuit, a second internal circuit, and a voltage down converter. In a normal operation mode, the first internal circuit receives a first external power supply voltage to operate. The second internal circuit receives from an internal power supply node an internal voltage of a level lower than the first external power supply voltage to operate. The voltage down converter generates an internal voltage at the internal power supply node. The voltage down converter includes a driver transistor, a burn-in voltage supply unit, and a burn-in control unit. The driver transistor electrically couples the first external power supply voltage with the internal power supply node according to a comparison between a reference voltage indicating a target level of the internal voltage and the internal voltage. The burn-in voltage supply unit electrically couples a second internal power supply voltage of a level lower than the first external power supply voltage and higher than the internal voltage with the internal power supply node in a burn-in test mode. The burn-in control unit forces the driver transistor off in a burn-in test mode. In a burn-in test mode, the first internal circuit receives a third external power supply voltage higher than the first external power supply voltage to operate whereas the second internal circuit receives a second external power supply voltage to operate.

The main advantage of the present invention is that the voltage down converter that supplies an internal voltage based on the first external power supply voltage to the second internal circuit cuts off the supply of the first external power supply voltage by the burn-in control unit in a burn-in test mode. The internal power supply node connected to the second internal circuit receives a second external power supply voltage of a level lower than the first external power supply voltage and higher than the internal voltage from the burn-in voltage supply unit. Accordingly, an effective burn-in test voltage can be supplied to the internal circuit that receives an internal voltage to operate in a burn-in test mode. Also, since the supply of the first external power supply voltage can be cut off, the occurrence of latch up depending upon the rising order of the two power supply voltages electrically connected to the internal power supply node can be obviated. An efficient burn-in test can be conducted with respect to an internal circuit that operates based on an internal voltage.

According to another aspect of the present invention, a semiconductor integrated circuit includes first and second internal circuits, and a voltage down converter. The first internal circuit receives a first external power supply voltage to operate in a normal operation mode. The second internal circuit receives an internal voltage of a level lower than the first external power supply voltage from an internal power supply node. The voltage down converter generates an internal voltage at the internal power supply node. The voltage down converter includes a reference voltage generation circuit, a voltage comparison circuit, a driver transistor, and an external pad. The reference voltage generation circuit generates at an internal node a reference voltage indicating a target level of the internal voltage in a normal operation mode, and suppresses generation of the reference voltage in a burn-in test mode. The voltage comparison circuit compares the voltage at the internal node with the internal voltage. The driver transistor electrically couples the first external power supply voltage with the internal power supply node according to the comparison result of the voltage comparison circuit. In a burn-in test mode, the external pad is coupled to the internal node to receive a second external power supply voltage of a level lower than the first external power supply voltage and higher than the internal voltage. In a burn-test mode, the first internal circuit receives a third external power supply voltage higher in level than the first external power supply voltage to operate.

According to the semiconductor integrated circuit of the present invention, the internal node that receives an input of a reference voltage in a normal mode, and connected to the voltage down converter receives the second external power supply voltage from the external pad in a burn-in test mode. Accordingly, the voltage down converter supplies to the second internal circuit a second external power supply voltage of a level higher than the internal voltage that is applied in a normal operation mode. Therefore, burn-in testing can be conducted efficiently for the second internal circuit that receives the internal voltage to operate in a normal mode.

According to a further aspect of the present invention, a semiconductor integrated circuit includes first and second internal circuits, and a voltage down converter. The first internal circuit receives a first external power supply voltage to operate in a normal operation mode. The second internal circuit receives from an internal power supply node an internal voltage lower in level than the first external power supply voltage to operate. The voltage down converter generates an internal voltage at the internal voltage supply node. The voltage down converter includes first and second reference voltage generation circuits, a voltage comparison circuit, and a driver transistor. The first reference voltage generation circuit generates at an internal node a first reference voltage indicating the target level of the internal voltage in a normal operation mode. The voltage comparison circuit compares the voltage of the internal node with the internal voltage. The driver transistor electrically couples the first external power supply voltage with the internal power supply node according to the comparison result of the voltage comparison circuit. The second reference voltage generation circuit generates at the internal node a second reference voltage lower in level than the external power supply voltage and higher than the first reference voltage in a burn-in test mode. In a burn-in test mode, the second reference voltage generation circuit selectively provides to the voltage comparison circuit one of a plurality of voltages obtained by dividing the external power supply voltage. In a burn-in test mode, the first internal circuit receives the third external power supply voltage higher in level than the first external power supply voltage to operate.

According to the semiconductor integrated circuit of the present invention, the voltage down converter receiving a first reference voltage in a normal operation mode is supplied with a second reference voltage from the second reference voltage generation circuit in a burn-in test mode. The second reference voltage from the second reference voltage generation circuit is adjusted in a burn-in test mode. Accordingly, the voltage down converter can supply a voltage higher in level than the internal voltage applied in a normal operation mode to the second internal circuit. Thus, burn-in testing of the second internal circuit that receives an internal voltage to operate in a normal operation mode can be conducted efficiently.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
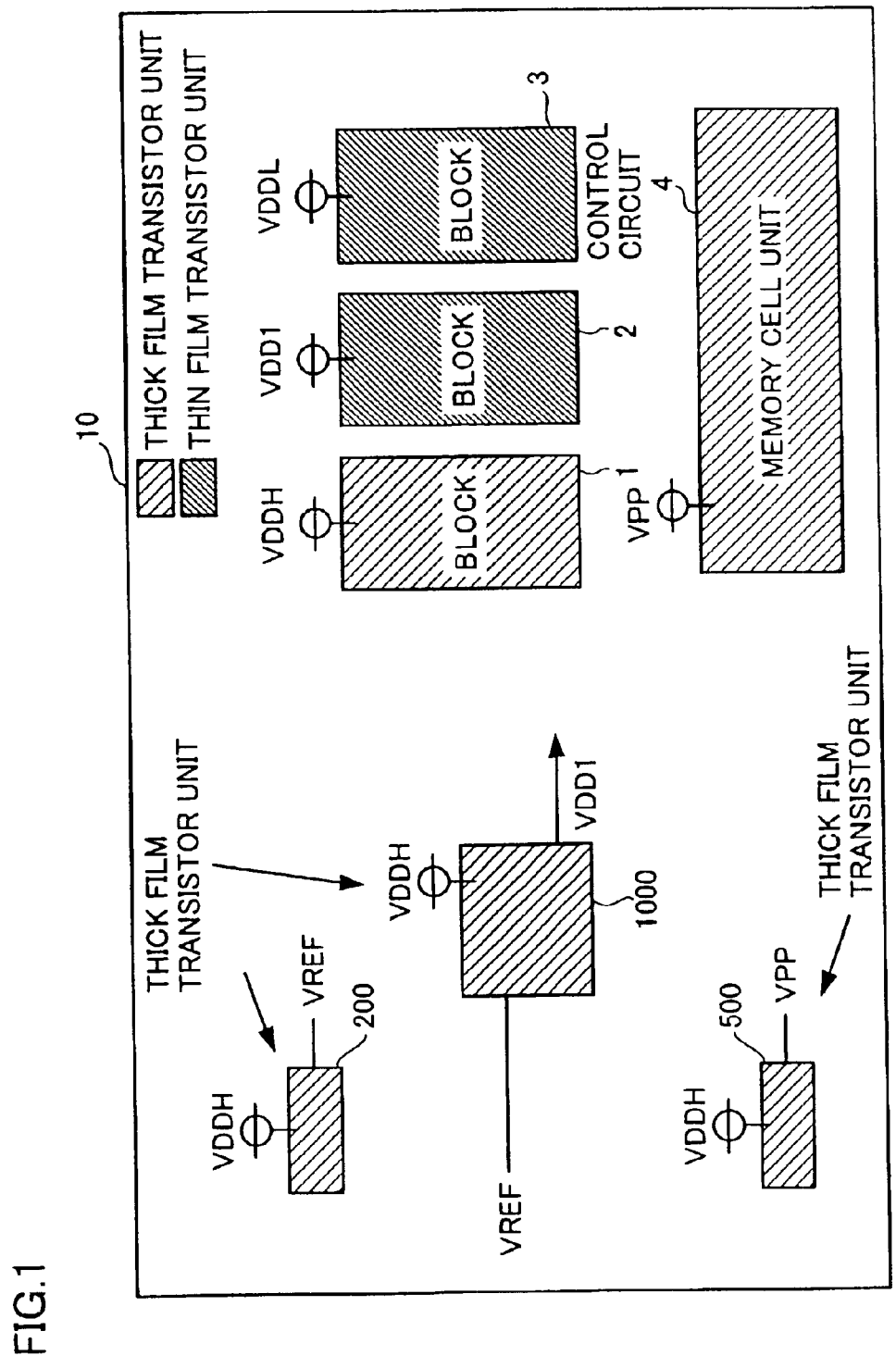
FIG. 1 is a schematic block diagram of a structure of DRAM circuitry.

Embodiments of the present invention will be described in detail with reference to the drawings. In the drawings, the same or corresponding components have the same reference characters allotted, and detailed description thereof will not be repeated.

First Embodiment

In the first embodiment, DRAM circuitry of an eDRAM circuit will be described.

Referring to FIG. 1, DRAM circuitry 10 includes a reference voltage generation circuit 200, a VDC circuit 1000, a VPP generation circuit 500, control circuit blocks 1–3, and a memory cell unit 4.

Reference voltage generation circuit 200 receives an external power supply voltage VDDH to generate a reference voltage VREF. VDC circuit 1000 receives reference voltage VREF and external power supply voltage VDDH to generate an internal voltage VDD1. VPP generation circuit 500 generates a voltage VPP employed in boosting a word line based on external power supply voltage VDDH. These circuits each receive external power supply voltage VDDH to operate, and must be formed of thick film transistors.

As to control circuit blocks 1–3, control circuit block 1 is formed of thick film transistors, supplied with external power supply voltage VDDH. Control circuit block 2 is formed of thin film transistors, using internal voltage VDD1 that is down converted by VDC circuit 1000. Control circuit block 3 is formed of thin film transistors, using external power supply voltage VDDL. Memory cell unit 4 is formed of thick film transistors, as described above, using a voltage VPP boosted by VPP generation circuit 500.

Figure 2:
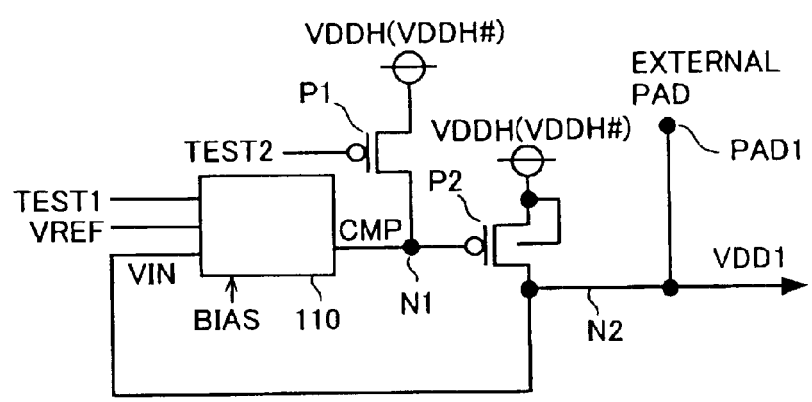
FIG. 2 shows a circuit structure of a VDC circuit adaptable to burn-in testing according to a first embodiment of the present invention.

Referring to FIG. 2, VDC circuit 1000 according to the first embodiment includes a differential amplifier 1100, and P channel MOS transistors P1 and P2.

Differential amplifier 110 is a current mirror amplifier, providing an output voltage CMP to a node N1 according to the input of reference voltage VREF and internal voltage VDD1. P channel MOS transistor P1 is connected between external power supply voltage VDDH (VDDH#) and node N1, and receives an input of a test signal TEST2 at its gate. P channel MOS transistor P2 is connected between external power supply voltage VDDH and a node N2, and has its gate connected to node N1. Specifically, P channel MOS transistor P2 receives the input of output voltage CMP from differential amplifier 110 at its gate. Node N2 is connected to an external pad PAD1.

Figure 3:
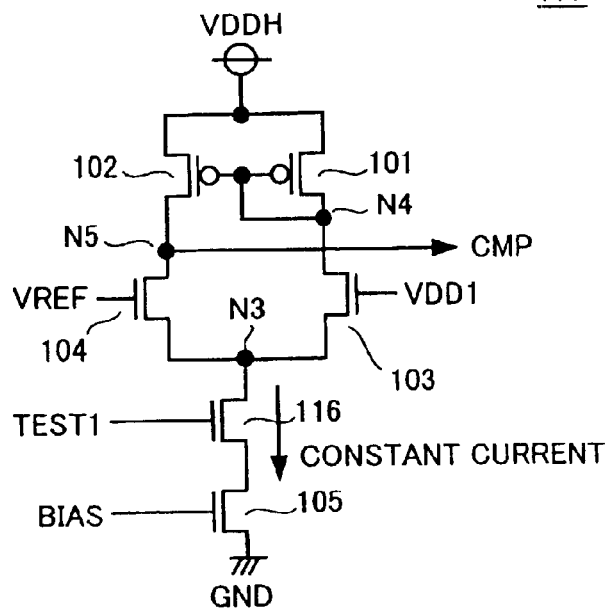
FIG. 3 shows a structure of a differential amplifier.

Referring to FIG. 3, differential amplifier 110 includes P channel MOS transistors 101 and 102, and N channel MOS transistors 103-105 and 116.

Figure 14:
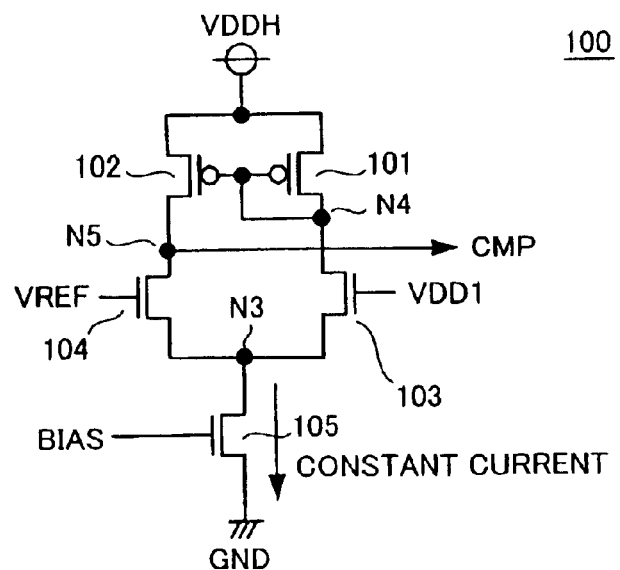
FIG. 14 shows a circuit structure of a differential amplifier 100.

Differential amplifier 110 differs from differential amplifier 100 shown in FIG. 14 in that an N channel MOS transistor 116 is further provided. The remaining elements are similar to those of differential amplifier 100. Therefore, detailed description thereof will not be repeated.

N channel MOS transistor 116 is connected in series with N channel MOS transistor 105, and between a node N3 and ground voltage GND. N channel MOS transistor 116 receives an input of a test signal TEST1 at its gate.

Differential amplifier 110 is supplied with a constant current according to the voltage level of bias signal BIAS as the operating current when test signal TEST1 is at an H level.

The operation of VDC circuit 1000 according to the first embodiment in a normal operation mode will be described here.

Test signals TEST1 and TEST2 are rendered active (to L level) in a burn-in test mode, and rendered inactive (H level) in a normal operation mode. Therefore, in a normal operation mode, transistor 116 is rendered conductive in response to test signal TEST1 (H level), and differential amplifier 110 is rendered active. P channel MOS transistor P1 is turned off in response to test signal TEST2 (H level).

When internal voltage VDD1 becomes lower than the level of reference voltage VREF, for example, the level of output voltage CMP, i.e., the gate voltage of P channel MOS transistor P2, also decreases. Accordingly, P channel MOS transistor P2 is rendered conductive, and internal voltage VDD1 is boosted. When internal voltage VDD1 becomes higher in level than reference voltage VREF, output voltage CMP increases. In response, P channel MOS transistor P2 is rendered non-conductive, whereby the current supply to node N2 is suppressed. Internal voltage VDD1 is lowered to the level of reference voltage VREF. Thus, internal voltage VDD1 of a level identical to that of reference voltage VREF is steadily supplied to control circuit block 2 in a normal operation mode.

The operation of VDC circuit 1000 in a burn-in test mode will be described hereinafter.

Test signals TEST1 and TEST2 are rendered active (L level) in a burn-in test mode. In response to test signal TEST1 (L level), transistor 116 is rendered non-conductive, and differential amplifier 110 is rendered inactive. P channel MOS transistor P is rendered conductive in response to test signal TEST2 (L level). P channel MOS transistor P2 is forced off, whereby VDC circuit 1000 is rendered inactive.

In a burn-in test mode, an external power supply voltage VDDL# of a level lower than external power supply voltage VDDH in a normal operation mode and set higher than the level for normal operation is applied to external pad PAD1. In response, an effective burn-in test voltage is supplied to the thin film transistor of control circuit block 2 that is driven by internal voltage VDD1.

Regarding the above-described latch up phenomenon, differential amplifier 110 and P channel MOS transistor P2 are inactive by the input of test signals TEST1 and TEST2 in a burn-in test mode. It is described in the previous section of the background art that latch up occurs depending upon the rising order of external power supply voltages VDDH# and VDDL when a P channel MOS transistor electrically coupled to internal voltage VDD1 operates in a CMOS structure formed of a P channel MOS transistor and an N channel MOS transistor. In the present structure, the P channel MOS transistor is forced to an off state, so that the above-described latch up encountered in a CMOS structure will not occur.

Therefore, burn-in testing can be conducted efficiently by supplying an effective burn-in test voltage to control circuit block 2 that is driven by an internal voltage and formed of thin film transistors without the occurrence of latch up.

In a burn-in test mode, the control circuit block formed of thick film transistors is applied with an external power supply voltage VDDH# directed to burn-in testing, corresponding to a boosted external power supply voltage VDDH which is an operating voltage. The control circuit block formed of thin film transistors is applied with an external power supply voltage VDDL# directed to burn-in testing, corresponding to a boosted external power supply voltage VDDL which is an operating voltage.

Specifically, control circuit blocks 1–2 of FIG. 1 are supplied with the power supply voltages set forth below in a normal operation mode and a burn-in test mode. In a normal operation mode, control circuit block 1 (first internal circuit) formed of thick film transistors receives the input of external power supply voltage VDDH (first external power supply voltage) to operate, and receives an external power supply voltage VDDH# (third external power supply voltage) in a burn-in test mode. Control circuit block 2 (second internal circuit) formed of thin film transistors receives internal voltage VDD1 (internal voltage) to operate in a normal operation mode, and receives external power supply voltage VDDL# (second external power supply voltage) in a burn-in test mode.

In a burn-in test mode, VDC circuit 1000 (voltage down converter) shown in FIG. 2 renders P channel MOS transistor P1 (burn-in control unit) conductive, and forces P channel MOS transistor P2 (driver transistor) to attain an off state. VDC circuit 1000 receives at node N2 (internal power supply node) that supplies the internal voltage an external power supply voltage VDDL# from external pad PAD1 (burn-in voltage supply unit), and outputs the external power supply voltage VDDL#.

The first embodiment has been described based on a structure in which external power supply voltage VDDL# is input from an external pad PAD1 to execute burn-in testing. The present invention is not limited thereto, and a structure can be employed in which a predetermined power supply voltage of a level lower than external power supply voltage VDDH and higher than internal voltage VDD1 of a normal state is supplied.

[Modification 1 of First Embodiment]

Figure 4:
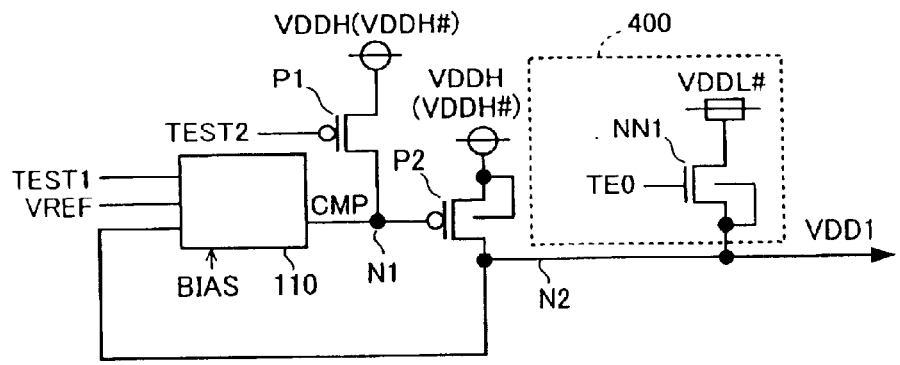
FIGS. 4, 5 and 6 show a circuit structure of a VDC circuit according to a first modification, a second modification, and a third modification, respectively, of the first embodiment of the present invention.

Referring to FIG. 4, a VDC circuit 1200 according to a first modification in the present embodiment differs from VDC circuit 1000 in that a burn-in voltage supply circuit 400 is provided. External power supply voltage VDDL# directed to burn-in testing is not supplied from the external pad. Burn-in voltage supply circuit 400 includes an N channel MOS transistor NN1 connected between external power supply voltage VDDL# and node N2, and receiving test signal TE0 at its gate. The structure of the remaining components of VDC circuit 1200 is similar to that of VDC circuit 1000 of the first embodiment. Therefore, detailed description thereof will not be repeated here. The operation of VDC circuit 1200 in a normal operation mode is similar to that previously described in the first embodiment. Therefore, detailed description thereof will not be repeated.

The operation of VDC circuit 1200 in a burn-in test mode will be described hereinafter.

In a burn-in test mode, test signals TEST1 and TEST2 are rendered active to an L level, whereby differential amplifier 110 is rendered inactive and P channel MOS transistor P2 is forced to an OFF state. In a burn-in test mode, test signal TE0 is set to an H level. Accordingly, node N2 is electrically coupled with external power supply voltage VDDL#, whereby internal voltage VDD1 is set to a voltage level substantially equal to external power supply voltage VDDL#. In response, an effective burn-in test voltage is supplied to the thin film transistors of control circuit block 2 that is driven by internal voltage VDD1.

In response to the above-described test signals TEST1 and TEST2 in a burn-in test mode, differential amplifier 110 is at an inactive state, and P channel MOS transistor P2 is forced to an off state. The burn-in voltage supply circuit is formed of an N channel MOS transistor, not a P channel MOS transistor. Therefore, latch up that occurs depending upon the rising order of external power supply voltages VDDH# and VDDL# in the P channel MOS transistor forming the CMOS structure in the present structure does not occur, similar to the first embodiment.

By the structure of the first modification of the first embodiment, burn-in testing can be conducted efficiently without occurrence of latch up by supplying an effective burn-in test voltage to control circuit block 2 that is formed of thin film transistors and driven by the internal voltage without occurrence of latch up.

In a burn-in test mode, the test can be conducted without having to provide a dedicated external pad. This is applicable to a semiconductor integrated circuit that is limited in the number of external pads.

[Second Modification of First Embodiment]

Figure 5:
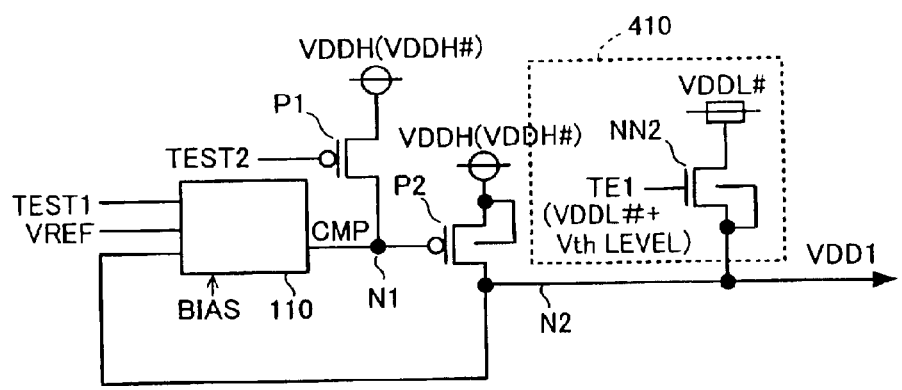

Referring to FIG. 5, a VDC circuit 1300 of the second modification differs from VDC circuit 1200 of the first modification in that a burn-in voltage supply circuit 410 is provided instead of burn-in voltage supply circuit 400. Burn-in voltage supply circuit 410 includes an N channel MOS transistor NN2 disposed between external power supply voltage VDDL# and node N2, receiving a test signal TE1 at its gate. The operation in a normal mode is similar to that of the first embodiment. Therefore, detailed description thereof will not be repeated.

Test signal TE1 is rendered active in a burn-in test mode, and set to the level of voltage VDDL#+Vth. Here, voltage, Vth is the threshold voltage of N channel MOS transistor NN2.

In addition to the advantage of the first modification of the first embodiment, the structure of the second modification of the first embodiment provides the advantage that a burn-in test voltage of higher accuracy can be supplied without destroying the thin film transistor by setting internal voltage VDD1 to a level identical to external power supply voltage VDDL# taking into consideration the drop of voltage occurring at transistor NN2 in a burn-in test mode.

By the reason similar to that previously described in the first modification of the first embodiment, latch up does not occur in a burn-in test mode in the present structure.

[Third Modification of First Embodiment]

Figure 6:
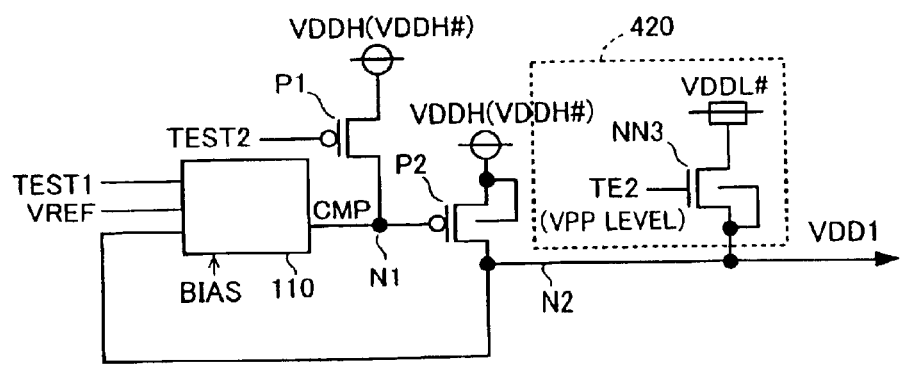

Referring to FIG. 6, a VDC circuit 1400 differs from VDC circuit 1300 of the second modification of the first embodiment in that a burn-in voltage supply circuit 420 is provided instead of burn-in voltage supply circuit 410. Burn-in voltage supply circuit 420 includes an N channel MOS transistor NN3 disposed between external power supply voltage VDDL# and node N2, receiving a test signal TE2 at its gate. The operation in a normal mode is similar to that previously described in the first embodiment. Therefore, detailed description thereof will not be repeated.

Test signal TE2 is rendered active in a burn-in test mode, and set to voltage VPP.

Voltage VPP is a voltage to drive the word line, and is generated at VPP generation circuit 500. Voltage VPP is higher in level than external power supply voltage VDDL#.

In addition to the advantage of the first modification in the first embodiment, the structure of the third modification of the first embodiment provides the advantage that burn-in testing can be conducted efficiently without destroying the oxide film of the thin film transistors in control circuit block 2 by applying a voltage VPP directed to driving a word line in a memory cell for signals applied to the gate of N channel MOS transistor NN3. It is to be particularly noted that the voltage level of test signal TE2 does not have to be set. By employing the signal generated by VPP generation circuit 500, the number of components in the circuit can be reduced.

By the reason similar to that previously described in the first modification of the first embodiment, latch up does not occur according to the present structure in a burn-in test mode.

Second Embodiment

In the previous first embodiment, differential amplifier 110 is rendered inactive and P channel MOS transistor P2 is forced off in response to a test signal. In other words, a structure of rendering the P channel MOS transistor that becomes the cause of latch up inactive to suppress generation of latch up and applying an effective burn-in test voltage to control circuit block 2 that operates by internal voltage VDD1 has been described. The second embodiment is directed to a structure that supplies an effective burn-in test voltage to a control circuit block 2 that operates with an internal voltage VDD1 without rendering the differential amplifier and the like inactive in a burn-in test mode.

Figure 7:
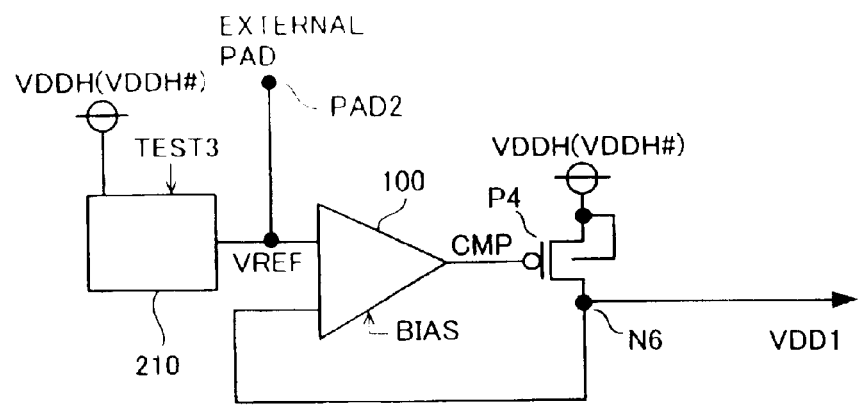
FIG. 7 shows a circuit structure of a VDC circuit according to a second embodiment of the present invention.

Referring to FIG. 7, a VDC circuit 2000 according to a second embodiment of the present invention includes a differential amplifier 100, a P channel MOS transistor P4, and a reference voltage generation circuit 210.

Differential amplifier 100 is a current mirror amplifier, generating an output voltage CMP according to a comparison result between reference voltage VREF from reference voltage generation circuit 210 and internal voltage VDD1.

P channel MOS transistor P4 is connected between external power supply voltage VDDH and a node N6, and receives an output voltage CMP from differential amplifier 100 at its gate. Internal voltage VDD1 is transmitted to node N6. The terminal of differential amplifier 100 to which reference voltage VREF is input is also connected to external pad PAD2.

The structure of differential amplifier 100 is similar to that of FIG. 14. Therefore, detailed description thereof will not be repeated. It is noted that the operation of VDC circuit 2000 in a normal mode is similar to that described with reference to FIG. 13.

Therefore, detailed description thereof will not be repeated.

Figure 8:
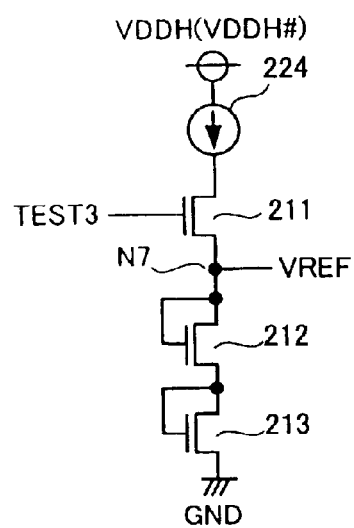
FIG. 8 shows a circuit structure of a reference voltage generation circuit.

Referring to FIG. 8, reference voltage generation circuit 210 includes a constant current source 224 connected to external power supply voltage VDDH, and N channel MOS transistors 211–213.

Figure 15:
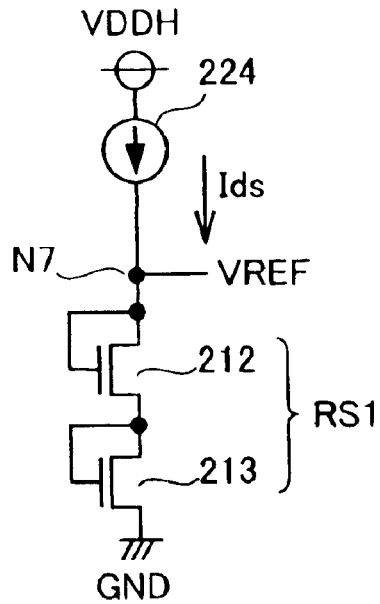
FIG. 15 shows a circuit structure of a reference voltage generation circuit 200 generating a reference voltage VREF.
Figure 16:
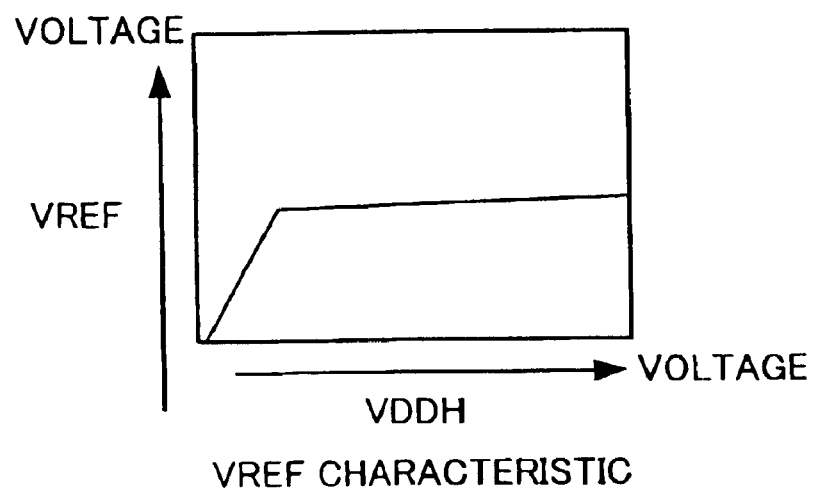
FIG. 16 is a VREF characteristic diagram of a reference voltage generation circuit.
Figure 17:
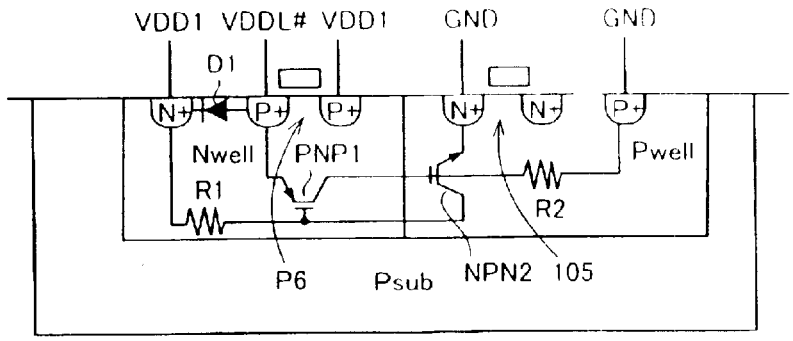
FIG. 17 is a cross sectional view of a CMOS structure formed of a P channel MOS transistor P6 and an N channel MOS transistor 105.
Figure 18:
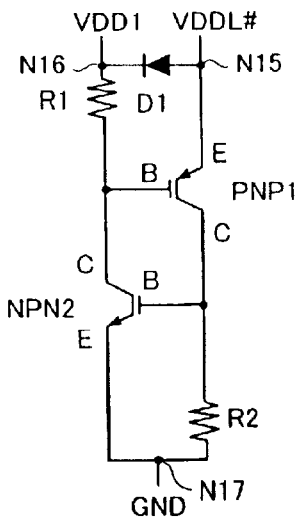
FIG. 18 shows a circuit structure of an equivalent circuit of a parasitic thyristor.
Figure 19:
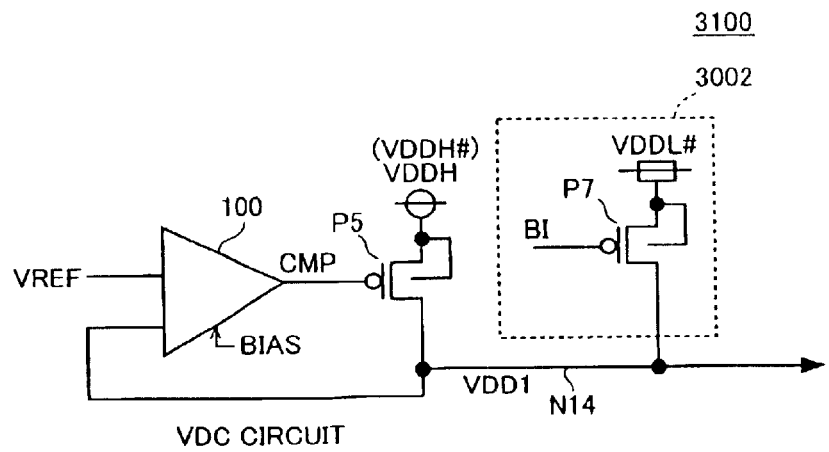
FIG. 19 shows a circuit structure of a VDC circuit 3100 having a burn-in voltage supply circuit 3001 replaced with a burn-in voltage supply circuit 3002.
Figure 20:
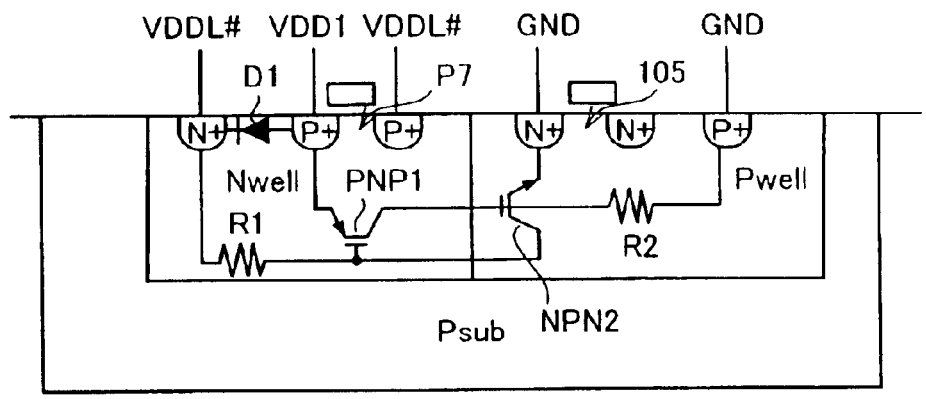
FIG. 20 is a sectional view of a CMOS structure formed of a P channel MOS transistor P7 and an N channel MOS transistor 105.
Figure 21:
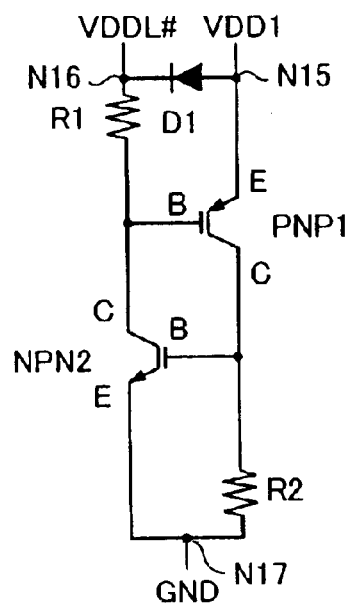
FIG. 21 shows an equivalent circuit of a parasitic thyristor.

Reference voltage generation circuit 210 differs from reference voltage generation circuit 200 of FIG. 15 in that a transistor 211 is further provided. N channel MOS transistor 211 is connected between constant current source 224 and an output node N7, and receives a test signal TEST3 at its gate. The remaining elements are similar to those of reference voltage generation circuit 200, and detailed description thereof will not be repeated.

Reference voltage VREF generated at reference voltage generation circuit 210 is applied to differential amplifier 100.

By setting test signal TEST3 to an L level in a burn-in test mode, the through current path in reference voltage generation circuit 210 is cut off. Reference voltage generation circuit 210 is rendered inactive.

In a burn-in test mode, external power supply voltage VDDL# directed to burn-in testing supplied from external pad PAD2 is applied to differential amplifier 100 as reference voltage VREF. In other words, an external power supply voltage VDDL# directed to burn-in testing is applied to differential amplifier 100 as reference voltage VREF without using the constant reference voltage VREF generated by reference voltage generation circuit 210 in a burn-in test mode.

Accordingly, internal voltage VDD1 generated by VDC circuit 2000 can be set to a level identical to external power supply voltage VDDL# in a burn-in test mode. Accordingly, an effective burn-in test voltage can be supplied to control circuit block 2 formed of thin film transistors that operate with internal voltage VDD1.

According to the present structure, the above-described latch up problem does not occur. As to the previous structure shown in FIG. 13, the problem of latch up occurring in a P channel MOS transistor depending upon the rising order of the two external power supply voltages both electrically coupled to node N14 has been described. According to the present structure, the rising order of the two external power supply voltages is of no concern since the level of voltage at output node N6 depends only on external power supply voltage VDDH.

By setting the voltage level of reference voltage VREF from an external pad according to the structure of the second embodiment, an effective burn-in voltage can be supplied to a control circuit block 2 formed of a thin film transistors, and driven by an internal voltage without the occurrence of latch up. Therefore, burn-in testing can be conducted efficiently.

[Modification of Second Embodiment]

A modification of the second embodiment is directed to a structure in which a reference voltage buffer circuit 300 is disposed between reference voltage generation circuit 210 and differential amplifier 100 in VDC circuit 2000 of FIG. 7.

Figure 9:
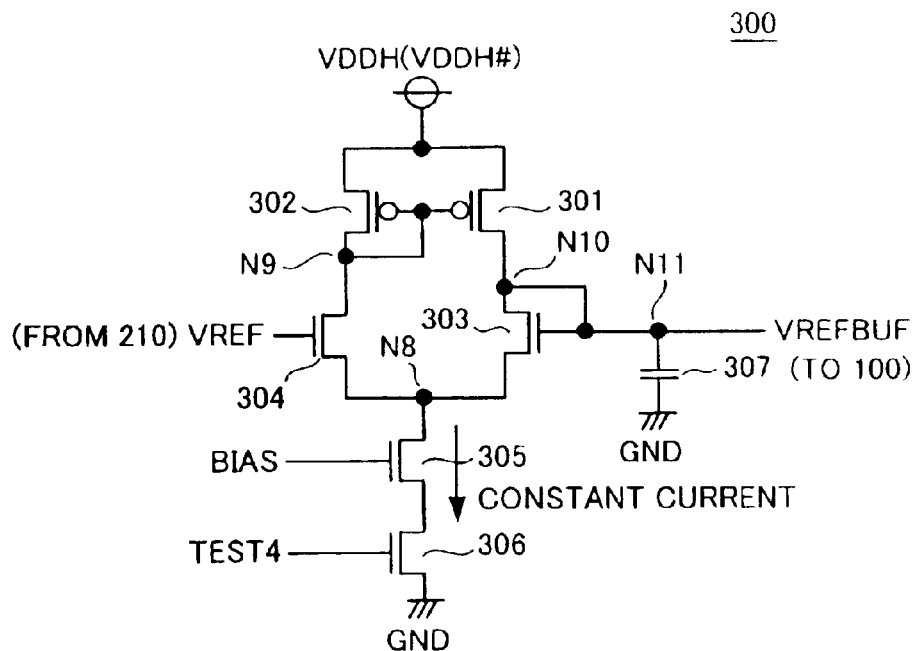
FIG. 9 shows a circuit structure of a reference voltage buffer circuit.

Referring to FIG. 9, reference voltage buffer circuit 300 compares reference voltage VREF and output voltage VREFBUF to set output voltage VREFBUF to a level identical to reference voltage VREF.

Reference voltage buffer circuit 300 includes P channel MOS transistors 301 and 302, N channel MOS transistors 303–306, and a capacitor 307.

N channel MOS transistors 305 and 306 are connected in series between a node N8 and ground voltage GND, and receives bias signal BIAS and a test signal TEST4 at respective gates. P channel MOS transistor 302 and N channel MOS transistor 304 are connected in series between external power supply voltage VDDH (VDDH#) and a node N8. N channel MOS transistor 304 receives reference voltage VREF at its gate.

P channel MOS transistor 301 and N channel MOS transistor 303 are connected in series between external power supply voltage VDDH (VDDH#) and node N8. P channel MOS transistors 301 and 302 have their gates electrically coupled with a node N9. A node N10 which is the connection node of P channel MOS transistor 301 and N channel MOS transistor 303 is electrically connected to a node N11, and the gate of N channel MOS transistor 303 is connected to node N11. Capacitor 307 is connected between node N11 and ground voltage GND. Output voltage VREFBUF generated at node N11 is applied to differential amplifier 100.

By virtue of this structure, a noise immunity of reference voltage VREF input to differential amplifier 100 can be improved by reference voltage buffer circuit 300 in a normal operation mode. As a result, the controllability of control circuit block 2 driven at internal voltage VDD1 is improved.

In a burn-in test mode, reference voltage buffer circuit 300 is rendered inactive by setting a test signal TEST4 to an L level. By supplying external power supply voltage VDDL# from external pad PAD2, internal voltage VDD1 can be set at a level identical to external power supply voltage VDDL#, as in the second embodiment.

In addition to the advantage of the second embodiment, the present structure provides the advantage that the controllability of internal voltage VDD1 is improved in a normal operation mode.

By the reason similar to that described above in the second embodiment, latch up does not occur in this modification of the second embodiment.

Third Embodiment

The third embodiment of the present invention is directed to a structure of supplying an effective burn-in test voltage to control circuit block 2 formed of thin film transistors by adjusting the reference voltage in a burn-in test mode without using the external pad described in the previous second embodiment.

Figure 10:
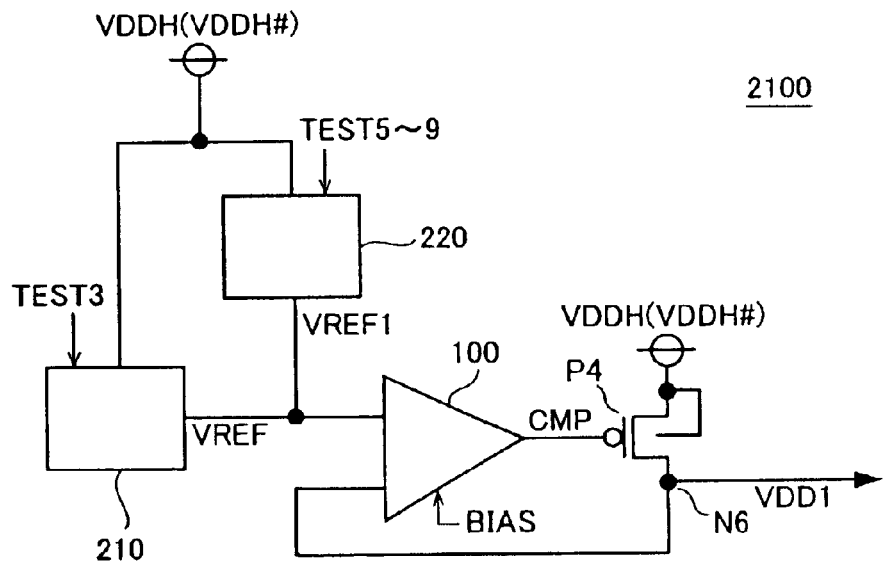
FIG. 10 shows a circuit structure of a VDC circuit according to a third embodiment of the present invention.

Referring to FIG. 10, a VDC circuit 2100 according to the third embodiment includes a differential amplifier 100, a P channel MOS transistor P4, and reference voltage generation circuits 210 and 220.

Differential amplifier 100 generates an output voltage CMP according to a comparison between either reference voltage VREF from reference voltage generation circuit 210 or reference voltage VREF 1 from reference voltage generation circuit 220 used in a burn-in test mode and internal voltage VDD1. P channel MOS transistor P4 is connected between external power supply voltage VDDH (VDDH#) and node N6, and receives output voltage CMP of differential amplifier 100 at its gate.

According to the structure of the third embodiment, internal voltage VDD1 is generated from differential amplifier 100 based on reference voltage VREF generated by reference voltage generation circuit 210 in a normal operation mode. In a burn-in test mode, internal voltage VDD1 is generated from differential amplifier 100 based on voltage VREF1 generated by reference voltage generation circuit 220 for burn-in testing. The structure of differential amplifier 100 is similar to that described with reference to FIG. 14. Therefore, detailed description thereof will not be repeated.

Figure 13:
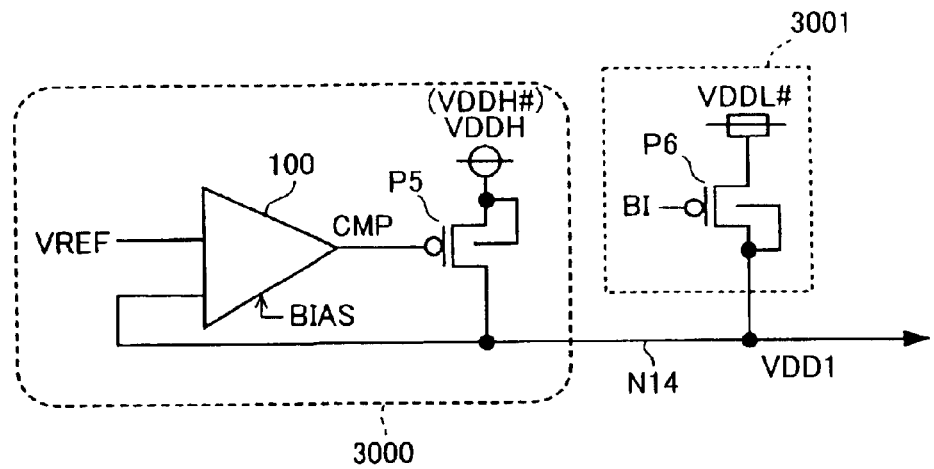
FIG. 13 is a schematic diagram of a conventional VDC circuit 3000.

The operation of VDC circuit 2100 in a normal operation mode is similar to that described with reference to FIG. 13. Therefore, detailed description thereof will not be repeated.

The reference voltage applied to differential amplifier 100 in a burn-in test mode will be described hereinafter.

Figure 11:
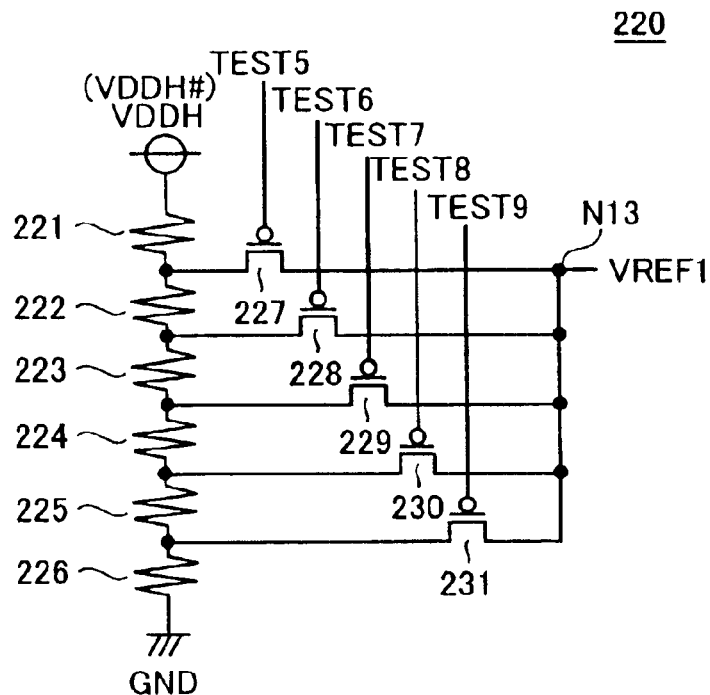
FIG. 11 shows a circuit structure of a reference voltage generation circuit that generates a reference voltage.
Figure 12:
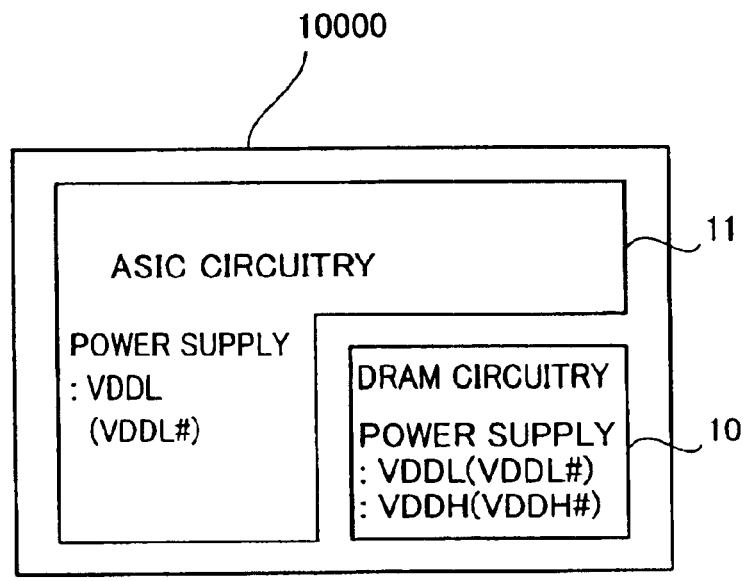
FIG. 12 is a schematic diagram of an eDRAM circuit 10000.

Referring to FIG. 11, reference voltage generation circuit 220 includes resistors 221–226, and P channel MOS transistors 227–231.

Respective connection nodes of resistors 221–226 connected in series are connected to a node N13 via P channel MOS transistors 227–231, respectively. Respective gates of P channel MOS transistors 227–231 receive test signals TEST5–TEST9, respectively.

Therefore, by selectively setting any of test signals TEST5–TEST9 to an L level, the level of reference voltage VREF1 can be rendered variable.

By switching reference voltage generation circuit 210 to reference voltage generation circuit 220 in a burn-in test mode and adjusting the level of reference voltage VREF1, internal voltage VDD1 can be set lower than external power supply voltage VDDH used in a normal operation and set higher than VDDL. Therefore, an effective burn-in test voltage can be supplied to control circuit block 2 formed of thin film transistors that operate based on internal voltage VDD1.

By the reason similar to that previously described in the second embodiment, latch up does not occur in the third embodiment.

By adjusting the voltage level of reference voltage VREF through reference voltage generation circuit 220 according to the structure of the third embodiment, an effective burn-in test voltage can be supplied to control circuit block 2 formed of thin film transistors. Control circuit block 2 operates at an internal voltage without the occurrence of latch up. Thus, an effective burn-in test can be conducted.

According to the structure of the present embodiment, reference voltage VREF can be adjusted internally without having to use an external pad. This is also applicable to a semiconductor integrated circuit where the number of external pads is limited.

The above description is based on burn-in testing of a control circuit formed of a thin film transistor and a thick film transistor in DRAM circuitry 10. It is to be noted that burn-in testing can be conducted in parallel to the DRAM circuitry for ASIC circuitry formed of thin film transistors in an eDRAM circuit. Furthermore, the present invention is also applicable to other semiconductor integrated circuits in addition to the eDRAM circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
a first internal circuit receiving a first external power supply voltage to operate in a normal operation mode;
a second internal circuit receiving an internal voltage lower than said first external power supply voltage from an internal power supply node to operate; and
a voltage down converter to generate said internal voltage at said internal power supply node,
said voltage down converter including
a driver transistor to electrically couple said first external power supply voltage and said internal power supply node according to a comparison between a reference voltage indicating a target level of said internal voltage and said internal voltage,
a burn-in voltage supply unit to electrically couple a second external power supply voltage lower than said first external power supply voltage and higher than said internal voltage with said internal power supply node in a burn-in test mode, and
a burn-in control unit to force said driver transistor to a turned off state in said burn-in test mode;
said first internal circuit receiving a third external power supply voltage higher than said first external power supply voltage to operate in said burn-in test mode, and
said second internal circuit receiving said second external power supply voltage to operate in said burn-in test mode.

2. The semiconductor integrated circuit according to claim 1, wherein a breakdown voltage of a transistor forming said first internal circuit is higher than said third external power supply voltage, and
a breakdown voltage of a transistor forming said second internal circuit is lower than said first external power supply voltage and higher than said second external power supply voltage.

3. The semiconductor integrated circuit according to claim 1, wherein said burn-in voltage supply unit includes an external pad coupled with said internal power supply node,
said external pad receiving said second external power supply voltage in said burn-in test mode.

4. The semiconductor integrated circuit according to claim 1, wherein said burn-in voltage supply unit includes an N channel field effect transistor to electrically couple said second external power supply voltage with said internal power supply node,
said N channel field effect transistor having its gates turned on in response to a test signal rendered active in said burn-in test mode.

5. The semiconductor integrated circuit according to claim 4, wherein said test signal is set to a voltage higher than a sum of said second external power supply voltage and a threshold voltage of said N channel field effect transistor.

6. The semiconductor integrated circuit according to claim 4, further comprising a boosting circuit boosting said first external power supply voltage to generate a boosted internal voltage,
said test signal being set to a voltage level of said boosted internal voltage in said burn-in test mode.

7. A semiconductor integrated circuit comprising:
a first internal circuit receiving a first external power supply voltage to operate in a normal operation;
a second internal circuit receiving an internal voltage lower than said first external power supply voltage from an internal power supply node to operate; and
a voltage down converter generating said internal voltage at said internal power supply node,
said voltage down converter including
a reference voltage generation circuit generating at an internal node a reference voltage indicating a target level of said internal voltage in said normal operation mode, and suppressing generation of said reference voltage in a burn-in test mode,
a voltage comparison circuit to compare a voltage at said internal node and said internal voltage,
a driver transistor to electrically couple said first external power supply voltage and said internal power supply node according to a comparison result of said voltage comparison circuit, and an external pad coupled to said internal node to receive a second external power supply voltage lower than said first external power supply voltage and higher than said internal voltage in said burn-in test mode, said first internal circuit receiving a third external power supply voltage higher than said first external power supply voltage to operate in said burn-in test mode.

8. The semiconductor integrated circuit according to claim 7, wherein said voltage down converter further includes a buffer circuit provided between said reference voltage generation circuit and said internal node to set a voltage of said internal node according to said reference voltage, said buffer circuit having a current switch to cut an operating current of said buffer circuit in said burn-in test mode.

9. A semiconductor integrated circuit comprising:

a first internal circuit receiving a first external power supply voltage to operate in a normal operation mode;

a second internal circuit receiving an internal voltage lower than said first external power supply voltage from an internal power supply node to operate; and a voltage down converter to generate said internal voltage at said internal power supply node, said voltage down converter including a first reference voltage generation circuit to generate a first reference voltage indicating a target level of said internal voltage at an internal node in a normal operation mode, a voltage comparison circuit to compare a voltage of said internal node and said internal voltage, a driver transistor to electrically couple said first external power supply voltage and said internal power supply node according to a comparison result of said voltage comparison circuit, and a second reference voltage generation circuit to generate a second reference voltage lower than said first external power supply voltage and higher than said first reference voltage at said internal node in a burn-in test mode, said second reference voltage generation circuit selectively providing to said voltage comparison circuit one of a plurality of voltages obtained by dividing said external power supply voltage as said second reference voltage in said burn-in test mode, said first internal circuit receiving a second external power supply voltage higher than said first external power supply voltage to operate in said burn-in test mode.

10. The semiconductor integrated circuit according to claim 9, wherein said second reference voltage generation circuit includes a plurality of resistance elements disposed between said external power supply voltage and a ground voltage, a plurality of transistor switches connected in parallel respectively between each node between every two adjacent resistance elements out of said plurality of resistance elements and said internal node, one of said plurality of transistor switches being selectively turned on in said burn-in test mode.

* * * * *